(12) United States Patent
Yamato et al.

(10) Patent No.: US 9,679,947 B2
(45) Date of Patent: Jun. 13, 2017

(54) SEMICONDUCTOR MEMORY DEVICE

(71) Applicant: Kabushiki Kaisha Toshiba, Minato-ku (JP)

(72) Inventors: Masaki Yamato, Yokkaichi (JP); Yasuhiro Nojiri, Yokohama (JP); Shigeki Kobayashi, Kuwana (JP); Hiroyuki Fukumizu, Yokohama (JP); Takeshi Yamaguchi, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/412,171

(22) Filed: Jan. 23, 2017

(65) Prior Publication Data

US 2017/0133586 A1 May 11, 2017

Related U.S. Application Data

(60) Continuation of application No. 14/966,184, filed on Dec. 11, 2015, which is a division of application No. (Continued)

(30) Foreign Application Priority Data

Jun. 6, 2013 (JP) .................................. 2013-119409

(51) Int. Cl.
*H01L 27/24* (2006.01)
*H01L 45/00* (2006.01)

(52) U.S. Cl.
CPC ........ *H01L 27/249* (2013.01); *H01L 27/2454* (2013.01); *H01L 27/2472* (2013.01); *H01L 45/085* (2013.01); *H01L 45/1226* (2013.01); *H01L 45/1233* (2013.01); *H01L 45/1253* (2013.01); *H01L 45/146* (2013.01); *H01L 45/04* (2013.01)

(58) Field of Classification Search
None
See application file for complete search history.

(56) References Cited

U.S. PATENT DOCUMENTS 7,382,018 B2   6/2008   Kim et al.
7,884,417 B2   2/2011   Mizukami et al.
(Continued)

FOREIGN PATENT DOCUMENTS

JP   2009-88446      4/2009
JP   2010-34112 A    2/2010
(Continued)

OTHER PUBLICATIONS

Office Action issued on May 10, 2016 in Japanese Patent Application No. 2013-119409 with English translation.

*Primary Examiner* — Andres Munoz
(74) *Attorney, Agent, or Firm* — Oblon, McClelland, Maier & Neustadt, L.L.P.

(57) ABSTRACT

A plurality of first conductive layers are stacked at a predetermined pitch in a first direction perpendicular to a substrate. A memory layer is provided in common on side surfaces of the first conductive layers and functions as the memory cells. A second conductive layer comprises a first side surface in contact with side surfaces of the first conductive layers via the memory layer, the second conductive layer extending in the first direction. A width in a second direction of the first side surface at a first position is smaller than a width in the second direction of the first side surface at a second position lower than the first position. A thickness in the first direction of the first conductive layer at the first position is larger than a thickness in the first direction of the first conductive layer at the second position.

15 Claims, 11 Drawing Sheets

Related U.S. Application Data

14/026,204, filed on Sep. 13, 2013, now Pat. No. 9,246,088.

(60) Provisional application No. 61/758,879, filed on Jan. 31, 2013.

(56) References Cited

U.S. PATENT DOCUMENTS

| | | | |
|---|---|---|---|
| 8,450,788 B2* | 5/2013 | Shim | H01L 27/11521 257/314 |
| 8,742,389 B2* | 6/2014 | Lee | H01L 27/228 257/2 |
| 9,246,088 B2 | 1/2016 | Yamato et al. | |
| 2008/0265235 A1 | 10/2008 | Kamigaichi et al. | |
| 2009/0141547 A1 | 6/2009 | Jin et al. | |
| 2010/0019310 A1 | 1/2010 | Sakamoto | |
| 2010/0270529 A1 | 10/2010 | Lung | |
| 2011/0140068 A1 | 6/2011 | Ozawa et al. | |
| 2012/0261638 A1 | 10/2012 | Sills et al. | |
| 2013/0187118 A1 | 7/2013 | Murooka | |

FOREIGN PATENT DOCUMENTS

| | | |
|---|---|---|
| JP | 2010-135527 A | 6/2010 |
| JP | 2011-129639 | 6/2011 |
| JP | 2011-233831 | 11/2011 |
| JP | 2012-4586 A | 1/2012 |

\* cited by examiner

SEMICONDUCTOR MEMORY DEVICE

CROSS REFERENCE TO RELATED APPLICATIONS

This application is a continuation of U.S. application Ser. No. 14/966,184, filed Dec. 11, 2015, which is a division of and claims the benefit of priority under 35 U.S.C. §120 from U.S. Ser. No. 14/026,204 filed Sep. 13, 2013, and claims the benefit of priority from U.S. Provisional Patent Application No. 61/758,879 filed Jan. 31, 2013, and claims the benefit of priority under 35 U.S.C. §119 from Japanese Patent Application 2013-119409 filed Jun. 6, 2013, the entire contents of each of which are incorporated herein by reference.

FIELD

Embodiments described herein relate to a semiconductor memory device.

BACKGROUND

As recent semiconductor memory devices become more integrated, the LSI devices become increasingly more compact. The more compact LSI devices request not only a smaller line width, but improved dimension and position accuracies of the circuit patterns. So, a ReRAM (Resistive RAM) is proposed that uses, as a memory, a variable resistance element that reversibly changes the resistance. Then, it is believed that the memory cell array can become more highly integrated by a structure of the ReRAM in which the variable resistance element is provided between side walls of word-lines extending in parallel with a substrate and side walls of bit-lines extending perpendicular to the substrate. Unfortunately, the memory cells connected to the bit-lines may have variation in their characteristics.

BRIEF DESCRIPTION OF THE DRAWINGS

FIG. 3 is viewed from the X direction.

DETAILED DESCRIPTION

A semiconductor memory device according to the embodiments described below includes a memory cell array comprising a plurality of memory cells. The memory cell array includes a plurality of first conductive layers, a memory layer, and a second conductive layer. The first conductive layers are stacked at a predetermined pitch in a first direction perpendicular to a substrate. The first conductive layers extend in a second direction parallel to the substrate. The memory layer is provided in common on side surfaces of the first conductive layers and functions as memory cells. The second conductive layer includes a first side surface in contact with side surfaces of the first conductive layers via the memory layer. A width in the second direction of the first side surface at a first position is smaller than a width in the second direction of the first side surface at a second position lower than the first position. A thickness in the first direction of the first conductive layer at the first position is larger than a thickness in the first direction of the first conductive layer at the second position.

First Embodiment

[Configuration]

Figure 1:
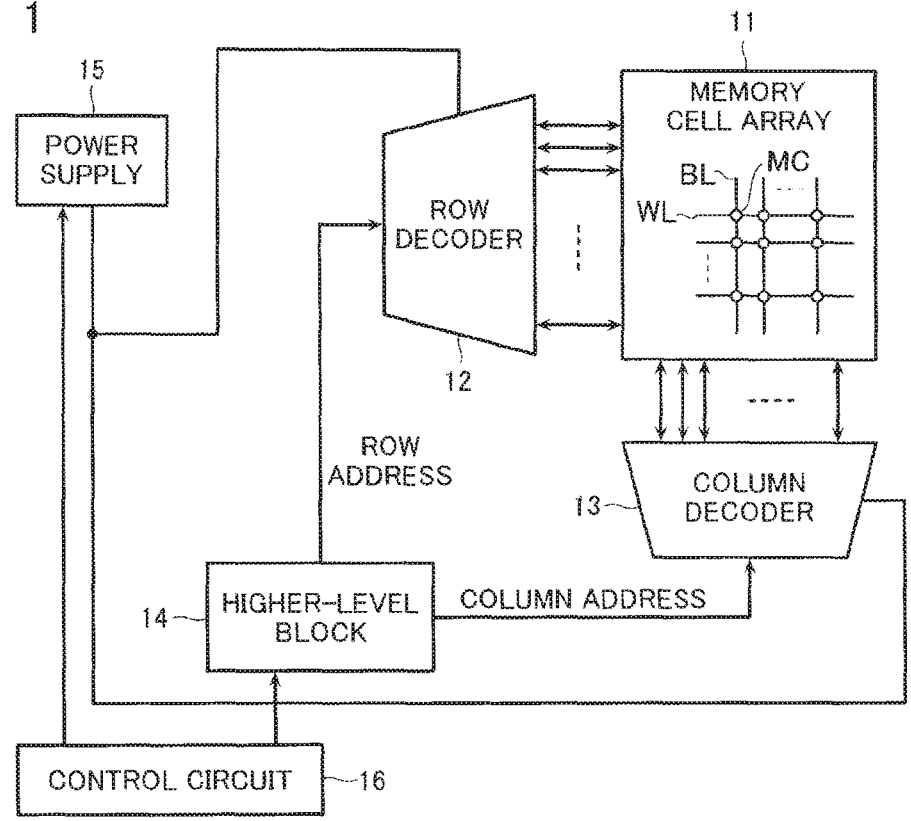
FIG. 1 is an example block diagram of a semiconductor memory device according to a first embodiment.

First, the entire configuration of a semiconductor memory device according to a first embodiment will be described. FIG. 1 is an example block diagram of the semiconductor memory device according to the first embodiment. With reference to FIG. 1, the semiconductor memory device includes a memory cell array 11, a row decoder 12, a column decoder 13, a higher-level block 14, a power supply 15, and a control circuit 16.

The memory cell array 11 includes word-lines WL and bit-lines BL, which intersect each other, and memory cells MC disposed in the intersections. The row decoder 12 selects a word line WL in accessing (data erase/write/read). The column decoder 13 selects a bit line BL in accessing and includes a driver to control the access operation.

The higher-level block 14 selects a memory cell MC in the memory cell array 11 that is to be accessed. The higher-level block 14 provides a row address and a column address to the row decoder 12 and the column decoder 13, respectively. The power supply 15 generates a predetermined voltage combination corresponding to each operation of data erase/write/read and supplies the voltage to the row decoder 12 and the column decoder 13. According to an external command, the control circuit 16 performs controls such as sending an address to the higher-level block 14, and controls the power supply 15.

Figure 2:
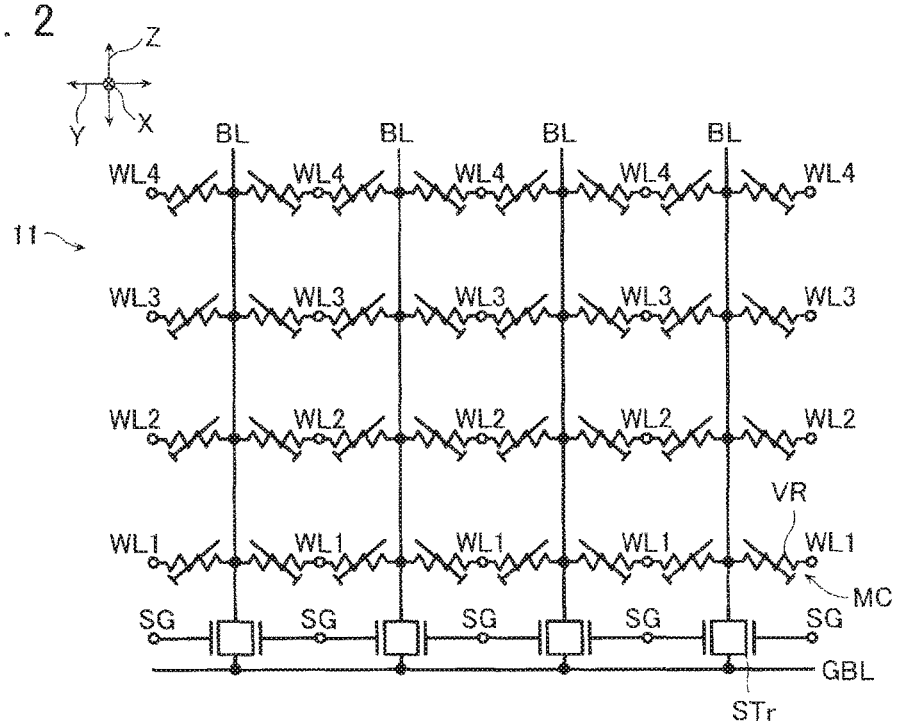
FIG. 2 is an example circuit diagram of a memory cell array 11 according to the first embodiment.
Figure 3:
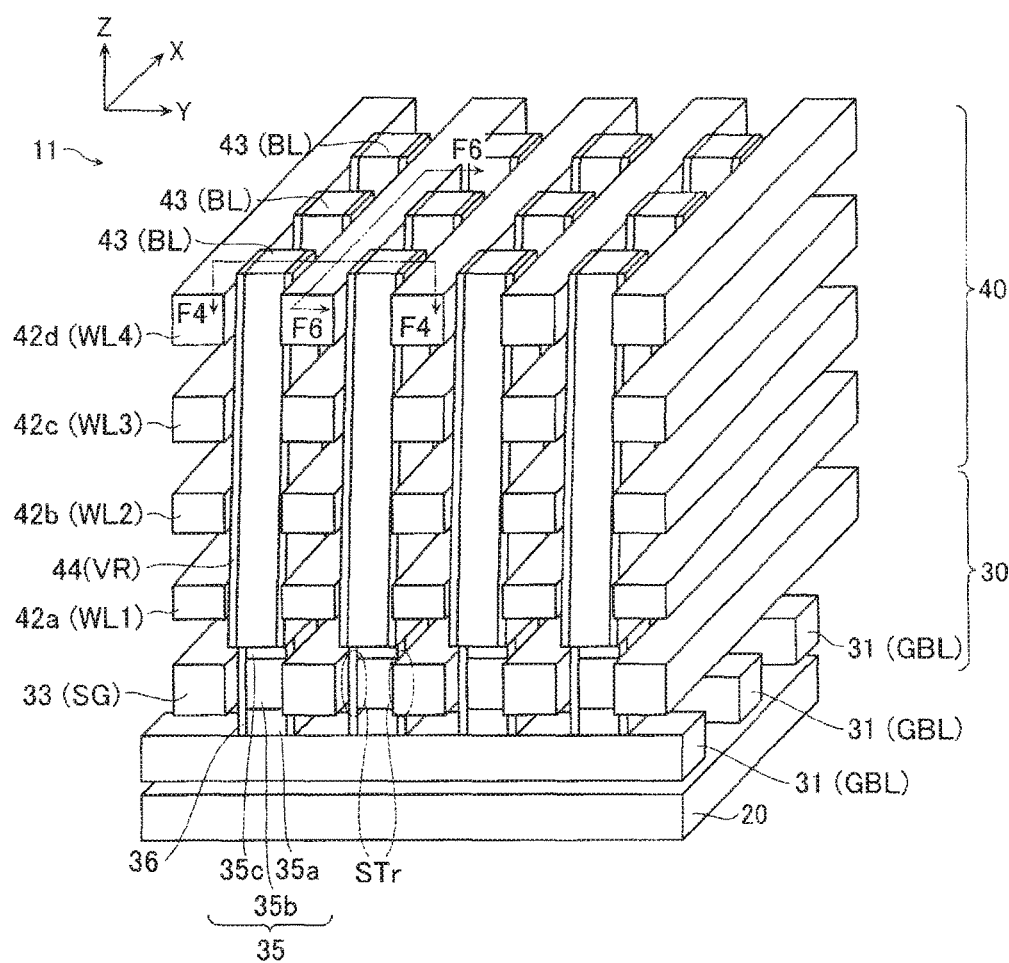
FIG. 3 is an example perspective view showing the stacked structure of the memory cell array 11 according to the first embodiment.

With reference now to FIGS. 2 and 3, the memory cell array 11 according to the first embodiment will be described in more detail. FIG. 2 is an example circuit diagram of the memory cell array 11. FIG. 3 is an example perspective view showing the stacked structure of the memory cell array 11. Note that in FIG. 2, the X direction, the Y direction, and the Z direction are perpendicular to each other, and the X direction is a direction perpendicular to the plane. In addition, the structure shown in FIG. 2 is repeated in the X direction.

With reference to FIG. 2, the memory cell array 11 includes the above word-lines WL, the bit-lines BL, and the memory cells MC, as well as a select transistor STr, a global bit-line GBL, and a select gate line SG.

With reference to FIGS. 2 and 3, the word lines WL1 to WL4 are arranged at a predetermined pitch in the Z direction and extend in the X direction. The bit lines BL are arranged in a matrix in the X and Y directions and extend in the Z direction. The memory cells MC are disposed at the intersections of the word-lines WL and the bit-lines BL. Therefore, the memory cells MC are arranged in a three-dimensional matrix in the X, Y, and Z directions. In various operations, selected word lines WL of the word lines WL1 to WL4 may be applied with the same voltage regardless of their positions in the Z direction. Non-selected word lines WL of the word lines WL1 to WL4 may also be applied with the same voltage regardless of their positions in the Z direction.

With reference to FIG. 2, each memory cell MC includes a variable resistive element VR. The variable resistance element VR is electrically rewritable and stores data in a non-volatile manner according to its resistance. The variable resistive element VR is changed from a high resistance state (reset state) to a low resistance state (set state) by a set operation that applies a certain voltage or higher across the element VR. The variable resistive element VR is also changed from the low resistance state (set state) to the high resistance state (reset state) by a reset operation that applies a certain voltage or higher across the element VR. In addition, immediately after the manufacture, the variable resistance element has difficulty to change its resistance state and is in the high resistance state. Then, a forming operation is performed that applies a high voltage across the variable resistance element VR, the voltage being equal to or higher than the set and reset operation voltages. The forming operation locally forms a region (filament path) in the variable resistance element VR that easily conducts current. The variable resistance element VR may thus easily change its resistance state and be operatable as a memory element.

With reference to FIG. 2, the select transistor STr is provided between a first end of a bit-line BL and the global bit-line GBL. Global bit lines GBL are arranged at a predetermined pitch in the X direction and extend in the Y direction. One of global bit-lines GBL is commonly connected to first ends of a plurality of select transistors STr aligned in the Y direction. In addition, the gate electrodes of two selection transistors STr arranged adjacently in the Y direction are commonly connected to each other. Select gate lines SG are arranged at a predetermined pitch in the Y direction and extend in the X direction. One of select gate lines SG is commonly connected to the gates of a plurality of select transistors STr aligned in the X direction. Note that the gate electrodes of two selection transistors STr arranged adjacently in the Y direction may be separated and the two selection transistors STr may be operated independently.

Figure 4:
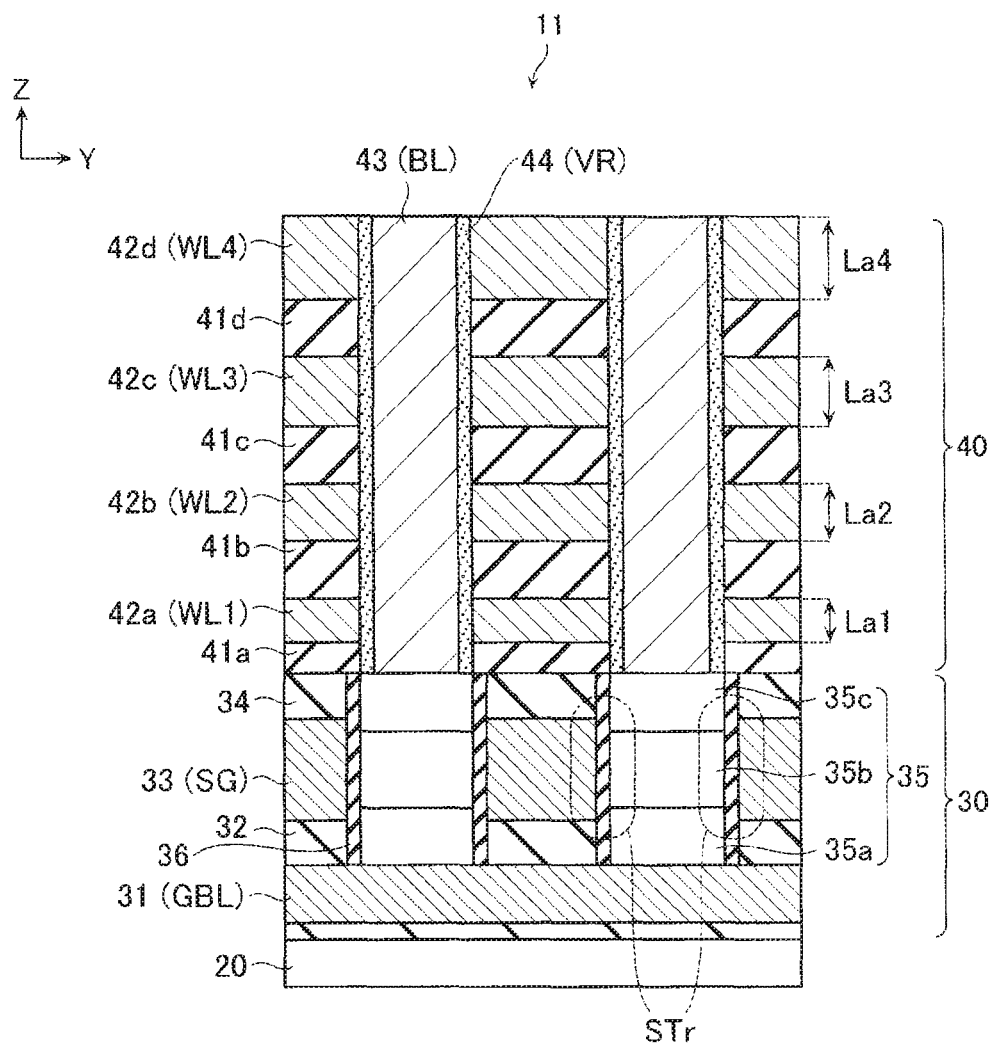
FIG. 4 is a figure when
Figure 5:
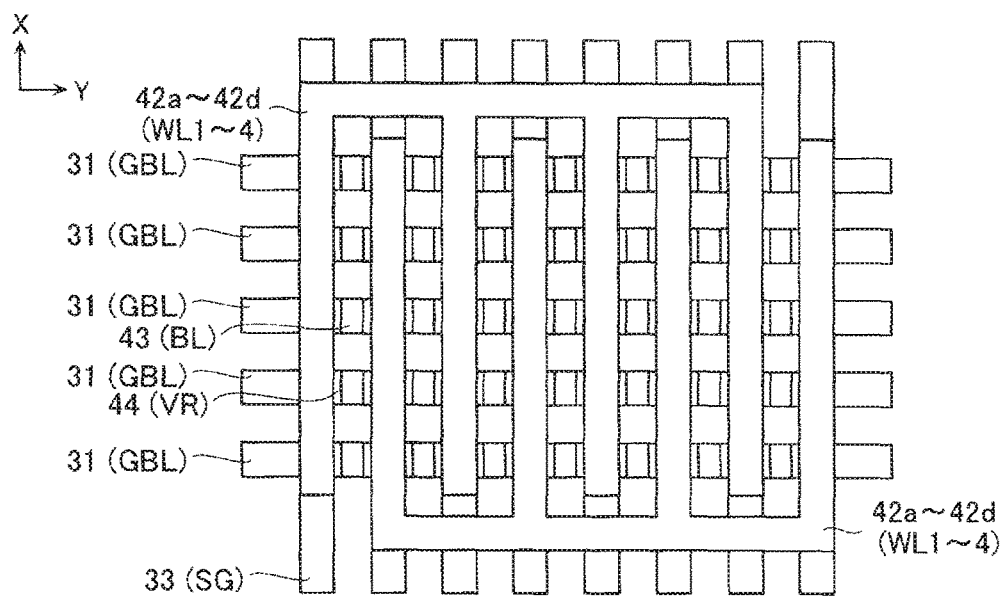
FIG. 5 is a top view of FIG. 3.

With reference now to FIGS. 3, 4 and 5, the stacked structure of the memory cell array 11 according to the first embodiment will be described. FIG. 4 shows the F4-F4 plane in FIG. 3 when viewed from the X direction (Z-Y plan view). FIG. 5 is a top view of FIG. 3. Note that in FIGS. 3 and 5, interlayer insulating layers are omitted.

With reference to FIGS. 3 and 4, the memory cell array 11 includes a substrate 20 and a selection transistor layer 30 and a memory layer 40, which are stacked on the memory 20. The selection transistor layer 30 functions as the selection transistors STr. The memory layer 40 functions as the memory cells MC.

With reference to FIGS. 3 and 4, the selection transistor layer 30 includes conductive layers 31, interlayer insulating layers 32, conductive layers 33, and interlayer insulating layers 34. The conductive layers 31, the interlayer insulating layers 32, the conductive layers 33, and the interlayer insulating layers 34 are stacked in the Z direction perpendicular to the substrate 20. The conductive layers 31 function as the global bit lines GBL. The conductive layers 33 function as the select gate lines SG and the gates of the selection transistors STr.

The conductive layers 31 are arranged at a predetermined pitch in the X direction parallel to the substrate 20, and extend in the Y direction (see FIG. 5). The interlayer insulating layers 32 cover the upper surfaces of the conductive layers 31. The conductive layers 33 are arranged at a predetermined pitch in the Y direction and extend in the X direction (see FIG. 5). The interlayer insulating layers 34 cover the side surfaces and the upper surfaces of the conductive layers 33. The conductive layers 31 and 33 are made of, for example, polysilicon. The interlayer insulating layers 32 and 34 are made of silicon dioxide ($SiO_2$).

With reference to FIGS. 3 and 4, the selection transistor layer 30 also includes columnar semiconductor layers 35 and gate insulating layers 36. The columnar semiconductor layers 35 function as the bodies (channels) of the selection transistors STr. The gate insulating layers 36 function as the gate insulating films of the selection transistors STr.

The columnar semiconductor layers 35 are disposed in a matrix in the X and Y directions, and extend in a columnar shape in the Z direction. In addition, the columnar semiconductor layers 35 are in contact with the upper surfaces of the conductive layers 31. The columnar semiconductor layers 35 are also in contact with the Y-direction side surfaces of the conductive layers 33 via the gate insulating layers 36. Then, each columnar semiconductor layer 35 includes a stack of an N+ type semiconductor layer 35a, a P+ type semiconductor layer 35b, and an N+ type semiconductor layer 35c.

With reference to FIGS. 3 and 4, the N+ type semiconductor layer 35a is in contact, on its Y-direction side surface, with the interlayer-insulating layer 32. The P+ type semiconductor layer 35b is in contact, on its Y-direction side surface, with a side surface of the conductive layer 33. The N+ type semiconductor layer 35c is in contact, on its Y-direction side surface, with the interlayer-insulating layer 34. The N+ type semiconductor layers 35a and 35c are made of N+ type impurity-implanted polysilicon. The P+ type semiconductor layer 35b is made of P+ type impurity-implanted polysilicon. The gate insulating layers 36 are made of, for example, silicon dioxide ($SiO_2$).

With reference to FIGS. 3 and 4, the memory layer 40 includes an alternating stack in the Z direction of interlayer insulating layers 41a to 41d and conductive layers 42a to

42*d*. The conductive layers 42*a* to 42*d* function as the word lines WL1 to WL4, respectively. Each of the conductive layers 42*a* to 42*d* includes a pair of comb-teeth shapes opposite in the X direction when viewed in the Z direction (see FIG. 5). The interlayer insulating layers 41*a* to 41*d* are made of, for example, silicon dioxide ($SiO_2$). The conductive layers 42*a* to 42*d* are made of, for example, polysilicon.

In addition, with reference to FIG. 4, among the conductive layers 42*a* to 42*d*, a conductive layer in an upper layer has a larger z-direction thickness. Specifically, the Z-direction thickness La4 of the conductive layers 42*d* is larger than the Z-direction thickness La3 of the conductive layers 42*c*, which is lower than the conductive layers 42*d*. Likewise, the Z-direction thickness La3 of the conductive layers 42*c* is larger than the Z-direction thickness La2 of the conductive layers 42*b*, which is lower than the conductive layers 42*c*. In addition, the Z-direction thickness La2 of the conductive layers 42*b* is larger than the Z-direction thickness La1 of the conductive layers 42*a*, which is lower than the conductive layers 42*b*. Here, it may be recognized that in the Z direction, the film thicknesses of the conductive layers 42*a* to 42*d* gradually increase.

With reference to FIGS. 3 and 4, the memory layer 40 also includes column conductive layers 43 and variable resistance layers 44. The column conductive layers 43 function as the bit lines BL. The variable resistance layers 44 function as the variable resistive elements VR.

The column conductive layers 43 are disposed in a matrix in the X and Y directions. The column conductive layers 43 are in contact with the upper surfaces of the columnar semiconductor layers 35 and extend in a columnar shape in the Z direction. The variable resistance layers 44 are provided between the Y-direction side surfaces of the column conductive layers 43 and the Y-direction side surfaces of the interlayer insulating layers 41*a* to 41*d*. The variable resistance layers 44 are also provided between the Y-direction side surfaces of the column conductive layers 43 and the Y-direction side surfaces of the conductive layers 42*a* to 42*d*. The column conductive layers 43 are made of, for example, polysilicon. The variable resistance layers 44 are made of, for example, metal oxide (such as $HfO_X$, $Al_2O_X$, $TiO_X$, $NiO_X$, $WO_X$, and $Ta_2O_X$).

Figure 6:
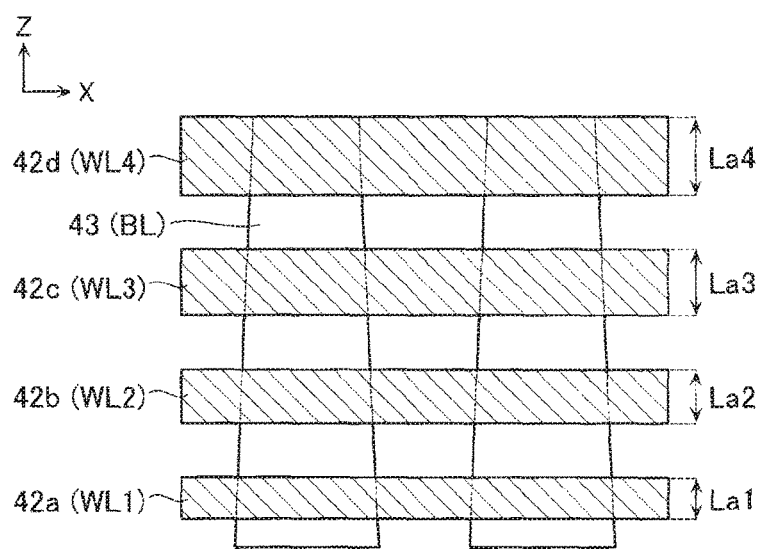
FIG. 6 is FIG. 3 when viewed in the Y direction.

With reference now to FIG. 6, the shapes of the columnar semiconductor layers 43 and the conductive layers 42*a* to 42*d* will be described more specifically. FIG. 6 shows the F6-F6 plane in FIG. 3 when viewed in the Y direction (Z-X plan view). Note that FIG. 6 omits the interlayer insulating layers 41*a* to 41*d* and the variable resistance layers 44.

With reference to FIG. 6, each columnar semiconductor layer 43 is formed in a tapered shape when viewed in the Y direction. The X-direction width of the Y-direction side surfaces of each columnar semiconductor layer 43 decreases when moving in the +Z direction (upward in FIG. 6). That is, the X-direction width of the Y-direction side surfaces of the columnar semiconductor layer 43 at a first position is smaller than the X-direction width of the Y-direction side surfaces of the columnar semiconductor layer 43 at a second position lower than the first position. Note that the tapered shape of each columnar semiconductor layer 43 may be formed by adjusting the etching condition in the manufacture as described below. In this embodiment as described above, among the conductive layers 42*a* to 42*d*, a conductive layer in an upper layer has a larger z-direction thickness. Here, if the conductive layers 42*a* to 42*d* have a uniform Z-direction thickness, the conductive layer 42*a* and each columnar semiconductor layer 43 have the maximum facing area and the conductive layer 42*d* and each columnar semiconductor layer 43 have the minimum facing area. Thus, the variable resistive elements VR formed between the conductive layers 42*a* to 42*d* (word lines WL1 to WL4) and each columnar semiconductor layer (bit-lines BL) have varied characteristics.

Then, in this embodiment, as shown in FIG. 6, according to the shape of each columnar semiconductor layer 43, among the conductive layers 42*a* to 42*d*, a conductive layer in an upper layer has a larger z-direction thickness La1 to La4. Therefore, the conductive layers 42*a* to 42*d* and each columnar semiconductor layer 43 may have a generally constant facing area. Thus, this embodiment may reduce the variation of the characteristics of the variable resistive elements VR.

[Manufacturing Method]

With reference now to FIGS. 7 to 10, a method of manufacturing the semiconductor memory device according to the first embodiment will be described. FIGS. 7 to 10 are example perspective views showing the method of manufacturing the memory cell array 11. Note that the manufacturing method described below includes only a method of manufacturing the memory layer 40.

Figure 7:
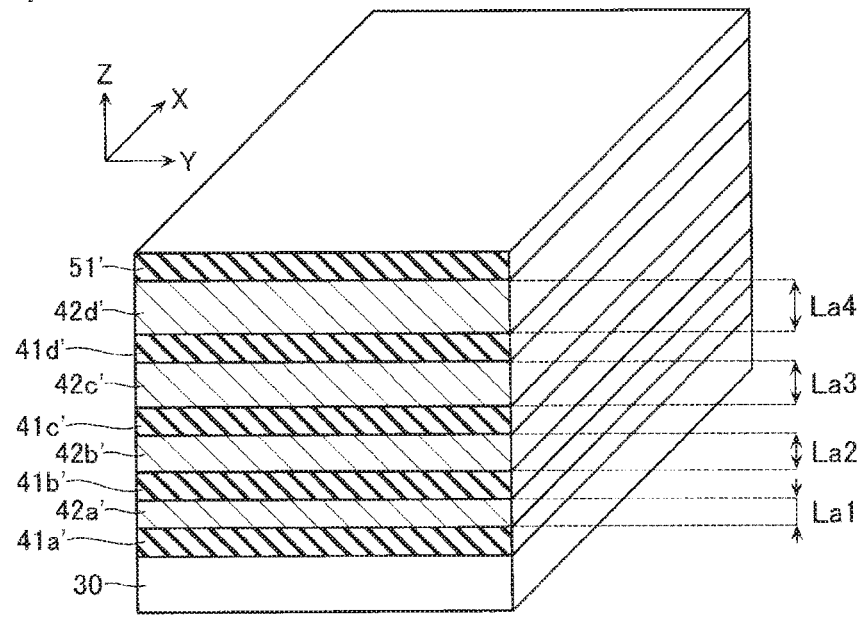
FIG. 7 is an example perspective view showing a method of manufacturing the memory cell array 11 according to the first embodiment.

With reference to FIG. 7, on the upper surface of the selection transistor layer 30, silicon dioxide ($SiO_2$) and polysilicon (Si) are alternately stacked to form interlayer insulating layers 41*a'* to 41*d'* and conductive layers 42*a'* to 42*d'*, which extend in the X and Y directions. In addition, on the conductive layer 42*d'*, a protection layer 51' is formed. Here, the Z-direction thickness La4 of the conductive layer 42*d'* is larger than the Z-direction thickness La3 of the conductive layer 42*c'*, which is lower than the conductive layer 42*d'*. Likewise, the Z-direction thickness La3 of the conductive layer 42*c'* is larger than the Z-direction thickness La2 of the conductive layer 42*b'*, which is lower than the conductive layer 42*c'*. In addition, the Z-direction thickness La2 of the conductive layer 42*b'* is larger than the Z-direction thickness La1 of the conductive layer 42*a'*, which is lower than the conductive layer 42*b'*. Here, it may be recognized that in the Z direction, the film thicknesses of the conductive layers 42*a'* to 42*d'* gradually increase. Note that various methods may be used including a simple method of making the film thicknesses of each two conductive layers the same and increasing the film thicknesses of the conductive layers every two layers.

Figure 8:
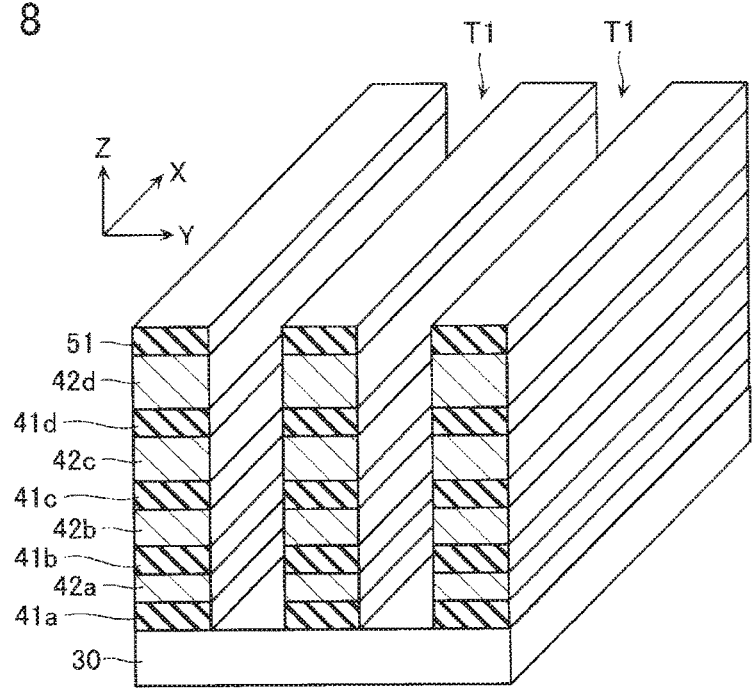
FIG. 8 is an example perspective view showing the method of manufacturing the memory cell array 11 according to the first embodiment.

With reference to FIG. 8, trenches T1 are formed that pass through the interlayer insulating layers 41*a'* to 41*d'*, the conductive layers 42*a'* to 42*d'*, and the protection layer 51'. The trenches T1 are arranged at a predetermined pitch in the Y direction and extend in the X direction. The trenches T1 change the interlayer insulating layers 41*a'* to 41*d'*, the conductive layers 42*a'* to 42*d'*, and the protection layer 51' to the interlayer insulating layers 41*a* to 41*d*, the conductive layers 42*a* to 42*d*, and the protection layer 51, respectively, which extend in the X direction.

Figure 9:
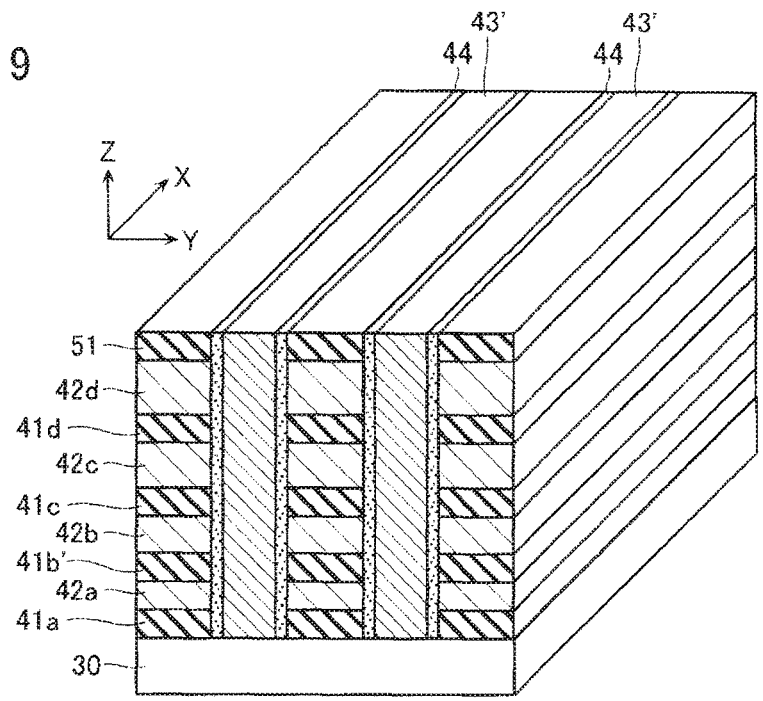
FIG. 9 is an example perspective view showing the method of manufacturing the memory cell array 11 according to the first embodiment.

With reference to FIG. 9, the variable resistance layers 44 are formed on the side surfaces of the trenches T1. Then, columnar semiconductor layers 43' are formed that fill the trenches T1. For example, the variable resistance layers 44 are formed by depositing metal oxide by atomic layer deposition (ALD). Here, the variable resistance layers 44 are formed in a planner manner on the whole side surfaces of the trenches T1.

Figure 10:
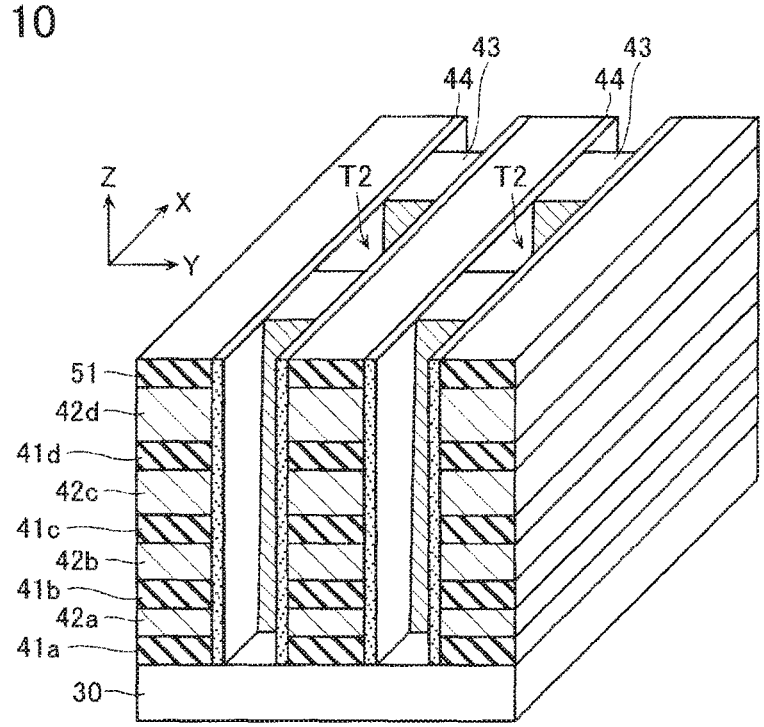
FIG. 10 is an example perspective view showing the method of manufacturing the memory cell array 11 according to the first embodiment.

With reference to FIG. 10, trenches T2 are formed that pass through the columnar semiconductor layers 43'. The trenches T2 are arranged at a predetermined pitch in the X direction. The trenches T2 form the columnar semiconductor layers 43' in a tapered shape when viewed in the XZ-plane, which provides the columnar semiconductor layers 43. Then, the trenches T2 are filled with silicon dioxide to form the interlayer insulating layers in the trenches T2.

Second Embodiment

[Configuration]

Figure 11:
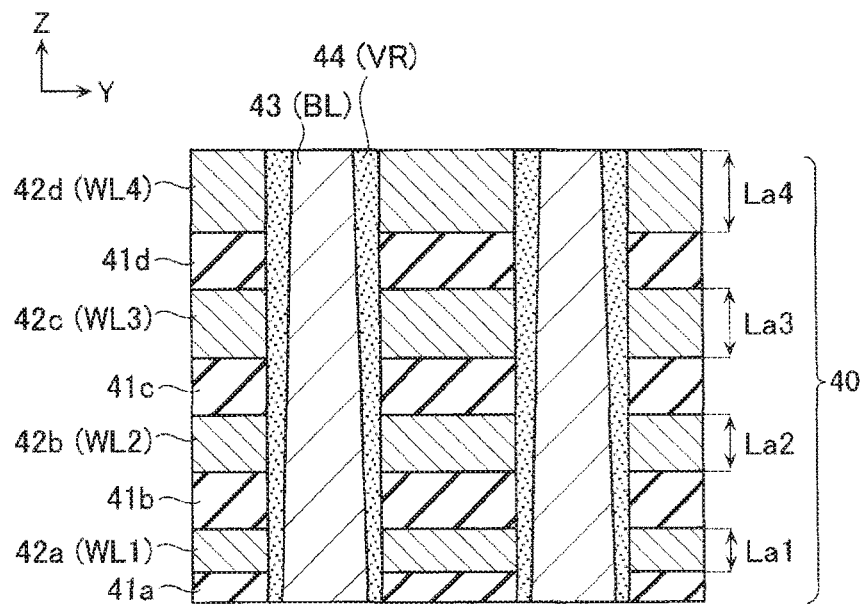
FIG. 11 illustrates a memory layer 40 according to a second embodiment when viewed in the X direction.

With reference now to FIG. 11, a semiconductor memory device according to a second embodiment will be described. FIG. 11 illustrates an example of the memory layer 40 of the second embodiment when viewed in the X direction. With reference to FIG. 11, in the memory layer 40 of the second embodiment, the Y-direction thickness of the variable resistance layer 44 decreases when moving in the −Z direction (downward in FIG. 11). Accordingly among the conductive layers 42a to 42d, a conductive layer positioned in an upper layer may need a higher voltage to change the resistance of the variable resistance layer 44 in contact therewith in some cases. Therefore, in the second embodiment, like the first embodiment, among the conductive layers 42a to 42d, a conductive layer positioned in an upper layer is given a larger thickness La1 to La4 in the z-direction. With the thicknesses, among the conductive layers 42a to 42d, a conductive layer positioned in an upper layer has smaller wiring resistance in the z-direction. Therefore, when the conductive layers 42a to 42d are applied with the same voltage at their ends to transfer a voltage to the variable resistance layer 44, the variable resistance layer 44 in an upper layer is applied with a higher voltage. Thus, the second embodiment may change the resistance of the variable resistance layer 44 uniformly.

In addition, the contact area between the upper-positioned conductive layer 42d and the variable resistance layer 44 is larger than the contact area between the lower-positioned conductive layer 42c and the variable resistance layer 44. Here, there is a tendency that as the film thickness of the variable resistance layer 44 increases, the forming voltage increases, and as the contact area between the conductive layer 42 and the variable resistance layer 44 increases, the forming voltage decreases. Therefore, even if the film thickness of the upper portion of the variable resistance layer 44 increases, the forming voltage will not increase because the contact area between the conductive layer 42d and the upper portion of the variable resistance layer 44 increases. Thus, the second embodiment may reliably perform the forming of the lower portion of the variable resistance layer 44 even if the same forming voltage is used from the upper to lower portions of the variable resistance.

Third Embodiment

[Configuration]

Figure 12:
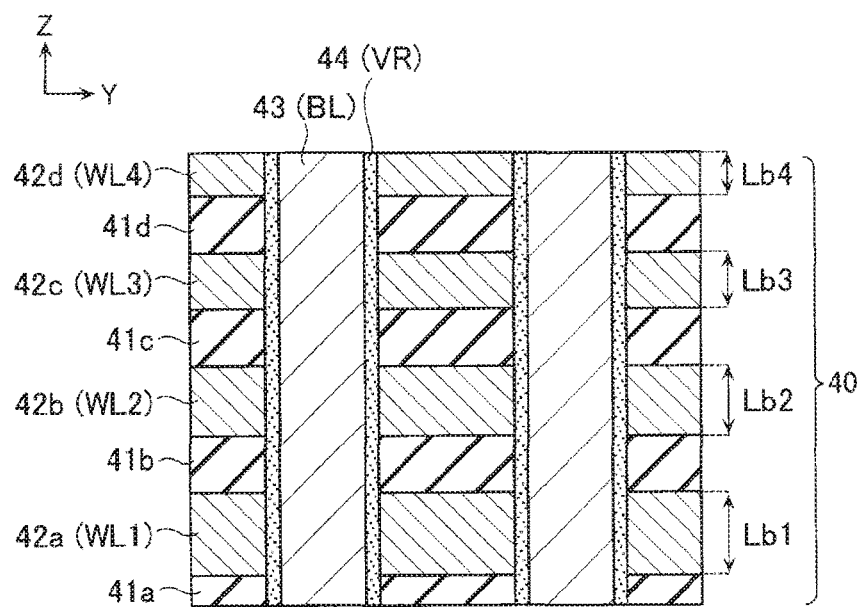
FIG. 12 illustrates a memory layer 40 according to a third embodiment when viewed in the X direction.
Figure 13:
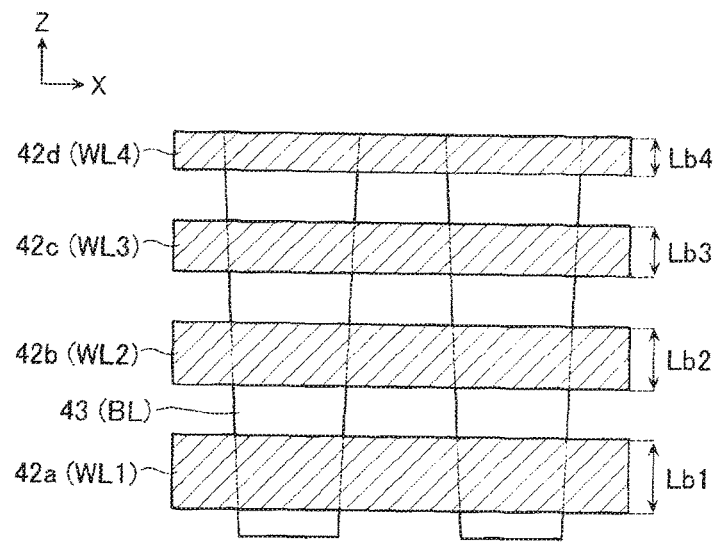
FIG. 13 illustrates the memory layer 40 according to the third embodiment when viewed in the Y direction.

With reference now to FIGS. 12 and 13, a semiconductor memory device according to a third embodiment will be described. FIG. 12 illustrates the memory layer 40 when viewed in the X direction. FIG. 13 illustrates the memory layer 40 when viewed in the Y direction. Note that FIG. 13 omits the interlayer insulating layers 41a to 41d and the variable resistance layer 44. In addition, the plane in FIG. 12 corresponds to the F4-F4 cross-section in FIG. 3 and the plane in FIG. 13 corresponds to the F6-F6 cross-section in FIG. 3.

In the third embodiment, with reference to FIG. 13, the columnar semiconductor layer 43 is formed in a reversely tapered shape when viewed in the Y direction, and the X-direction width of the Y-direction side surfaces of the columnar semiconductor layer 43 gradually decreases when moving in the −Z direction (downward in FIG. 13). That is, the X-direction width of the Y-direction side surfaces of the columnar semiconductor layer 43 at a first position is smaller than the X-direction width of the Y-direction side surfaces of the columnar semiconductor layer 43 at a second position higher than the first position. Note that the reversely tapered shape of the columnar semiconductor layer 43 may be formed by adjusting the etching condition in the manufacture as described below. Here, if the conductive layers 42a to 42d have a uniform Z-direction thickness, the conductive layer 42d and each columnar semiconductor layer 43 have the maximum facing area and the conductive layer 42a and each columnar semiconductor layer 43 have the minimum facing area. Thus, the variable resistive elements VR formed between the conductive layers 42a to 42d (word lines WL1 to WL4) and each columnar semiconductor layer 43 (bit-lines BL) have varied characteristics.

Then, in this embodiment, with reference to FIGS. 12 and 13, according to the shape of each columnar semiconductor layer 43, among the conductive layers 42a to 42d, a conductive layer in a lower layer has a larger z-direction thickness Lb1 to Lb4. Specifically, the Z-direction thickness Lb1 of the conductive layer 42a is larger than the Z-direction thickness Lb2 of the conductive layer 42b, which is upper than the conductive layer 42a. Likewise, the Z-direction thickness Lb2 of the conductive layer 42b is larger than the Z-direction thickness Lb3 of the conductive layer 42c, which is upper than the conductive layer 42b. In addition, the Z-direction thickness Lb3 of the conductive layer 42c is larger than the Z-direction thickness Lb4 of the conductive layer 42d, which is upper than the conductive layer 42c. Therefore, the conductive layers 42a to 42d and each columnar semiconductor layer 43 may have a generally constant facing area. Thus, this embodiment may reduce the variation of the characteristics of the variable resistive elements VR.

[Manufacturing Method]

With reference now to FIGS. 14 to 17, an example method of manufacturing the semiconductor memory device according to the third embodiment will be described. FIGS. 14 to 17 perspective views showing the method of manufacturing the memory cell array 11. Note that the manufacturing method described below includes only a method of manufacturing the memory layer 40.

Figure 14:
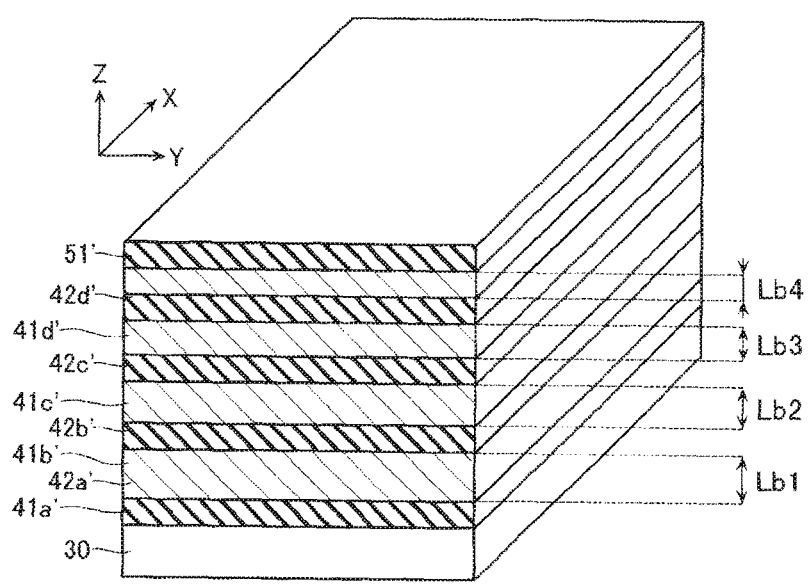
FIG. 14 is an example perspective view showing a method of manufacturing a memory cell array 11 according to the third embodiment.

With reference to FIG. 14, like the first embodiment, the interlayer insulating layers 41a' to 41d', the conductive layers 42a' to 42d', and the protection layer 51' are formed. Here, the Z-direction thickness Lb1 of the conductive layer 42a' is larger than the Z-direction thickness Lb2 of the conductive layer 42b', which is upper than the conductive layer 42a'. Likewise, the Z-direction thickness Lb2 of the conductive layer 42b' is larger than the Z-direction thickness Lb3 of the conductive layer 42c', which is upper than the conductive layer 42b'. In addition, the Z-direction thickness Lb3 of the conductive layer 42c' is larger than the Z-direction thickness Lb4 of the conductive layer 42d', which is upper than the conductive layer 42c'. Here, it may be recognized that in the Z direction, the film thicknesses of the conductive layers 42a' to 42d' gradually decrease. Note that various methods may be used including a simple method of making the film thicknesses of each two conductive layers the same and decreasing the film thicknesses of the conductive layers every two layers.

Figure 15:
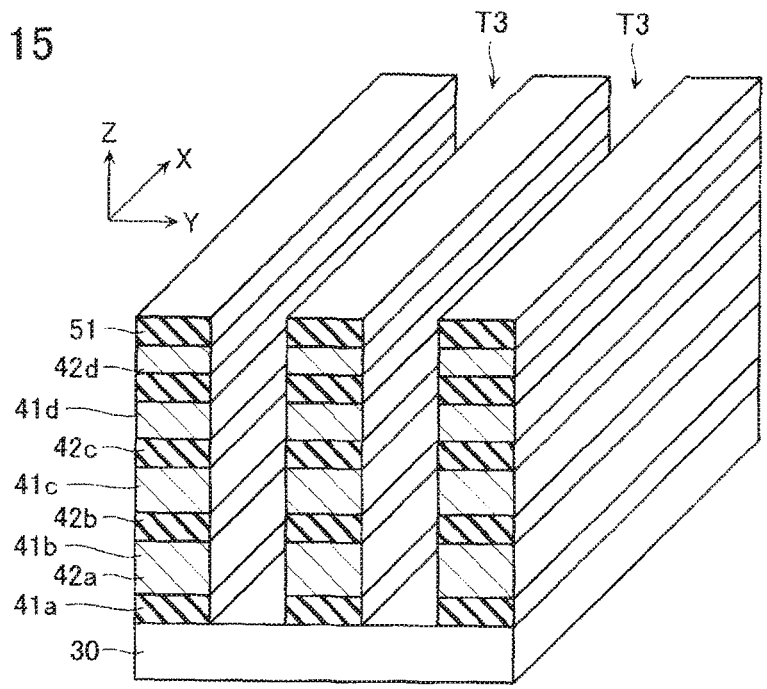
FIG. 15 is an example perspective view showing the method of manufacturing the memory cell array 11 according to the third embodiment.

With reference to FIG. 15, like the trenches T1 in the first embodiment, trenches T3 are formed that pass through the interlayer insulating layers 41a' to 41d', the conductive layers 42a' to 42d', and the protection layer 51'. The trenches T3 are arranged at a predetermined pitch in the X direction. The trenches T3 change the interlayer insulating layers 41a' to 41d', the conductive layers 42a' to 42d', and the protection layer 51' to the interlayer insulating layers 41a to 41d, the conductive layers 42a to 42d, and the protection layer 51, respectively, which extend in the X direction.

Figure 16:
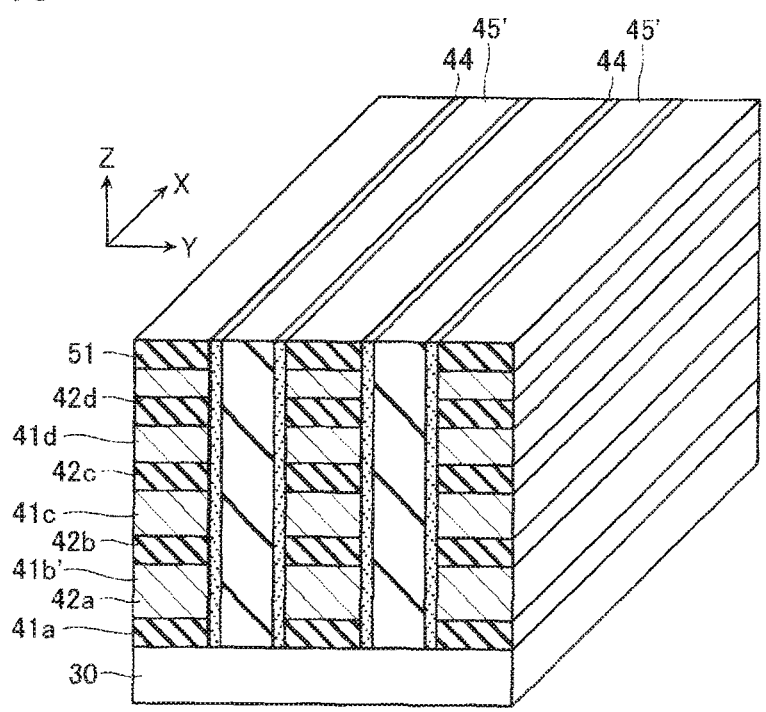
FIG. 16 is an example perspective view showing the method of manufacturing the memory cell array 11 according to the third embodiment.

With reference to FIG. 16, the variable resistance layers 44 are formed on the side surfaces of the trenches T3. Then, interlayer insulating layers 45' are formed that fill the trenches T3.

Figure 17:
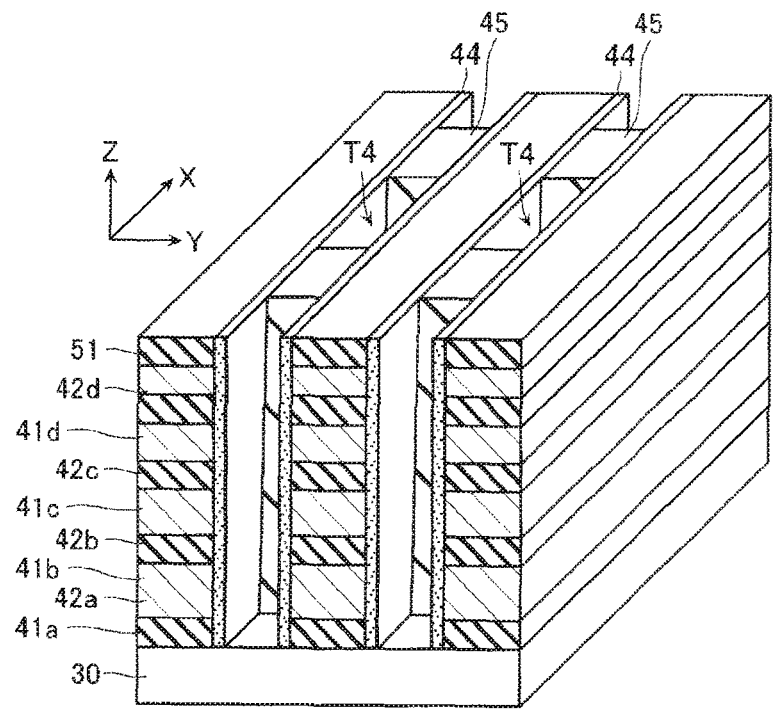
FIG. 17 is an example perspective view showing the method of manufacturing the memory cell array 11 according to the third embodiment.

Then, with reference to FIG. 17, trenches T4 are formed that pass through the interlayer insulating layers 45'. The trenches T4 are arranged at a predetermined pitch in the X direction. The trenches T4 form the interlayer insulating layers 45' in a tapered shape in the XZ-plane, which provides the interlayer insulating layers 45. Then, the trenches T4 are filled with polysilicon to form the columnar semiconductor layers 43 in the trench T4.

Fourth Embodiment

[Configuration]

Figure 18:
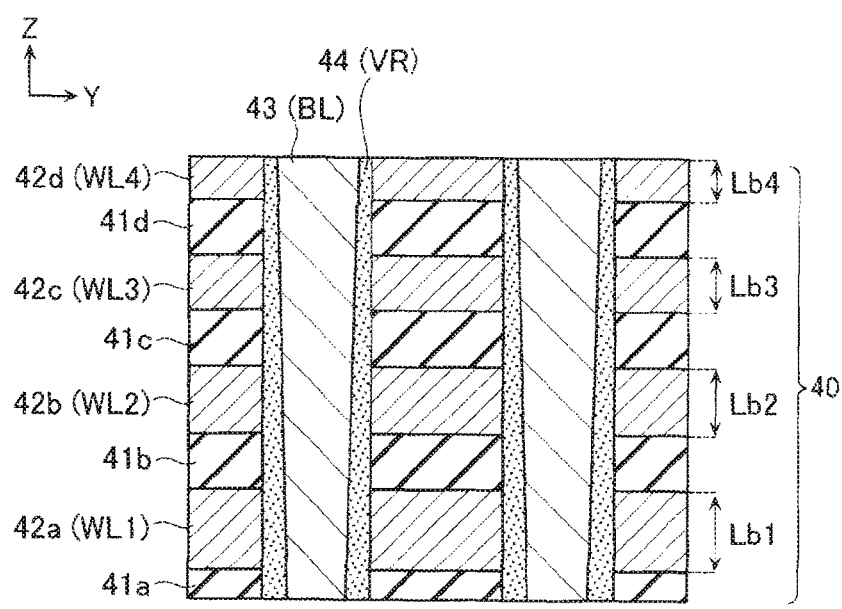
FIG. 18 illustrates a memory layer 40 according to a fourth embodiment when viewed in the X direction.

With reference now to FIG. 18, an example of a semiconductor memory device according to a fourth embodiment will be described. FIG. 18 illustrates the memory layer 40 when viewed in the X direction. With reference to FIG. 18, in the memory layer 40 of the fourth embodiment, the Y-direction thickness of the variable resistance layer 44 increases when moving in the −Z direction (downward in FIG. 11). Accordingly among the conductive layers 42d to 42b, a conductive layer positioned in a lower layer may need a higher voltage to change the resistance of the variable resistance layer 44 in contact therewith in some cases. Therefore, in the fourth embodiment, like the third embodiment, among the conductive layers 42a to 42d, a conductive layer in a lower layer has a larger z-direction thickness Lb1 to Lb4 in the z-direction. With the thicknesses, among the conductive layers 42a to 42d, a conductive layer positioned in a lower layer has smaller wiring resistance in the z-direction. Therefore, when the conductive layers 42a to 42d are applied with the same voltage at their ends to transfer a voltage to the variable resistance layer 44, the variable resistance layer 44 in a lower layer is applied with a higher voltage. Thus, the fourth embodiment may change the resistance of the variable resistance layer 44 uniformly.

In addition, the contact area between the lower-positioned conductive layer 42a and the variable resistance layers 44 is larger than the contact area between the upper-positioned conductive layer 42b and the variable resistance layer 44. Here, there is a tendency that as the film thickness of the variable resistance layer 44 increases, the forming voltage increases, and as the contact area between the conductive layer 42 and the variable resistance layer 44 increases, the forming voltage decreases. Therefore, even if the film thickness of the lower portion of the variable resistance layer 44 increases, the forming voltage will not increase because the contact area between the conductive layer 42a and the lower portion of the variable resistance layer 44 increases. Thus, the fourth embodiment may reliably perform the forming of the lower portion of the variable resistance layer 44 even if the same forming voltage is used from the upper to lower portions of the variable resistance.

[Others]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

Figure 19:
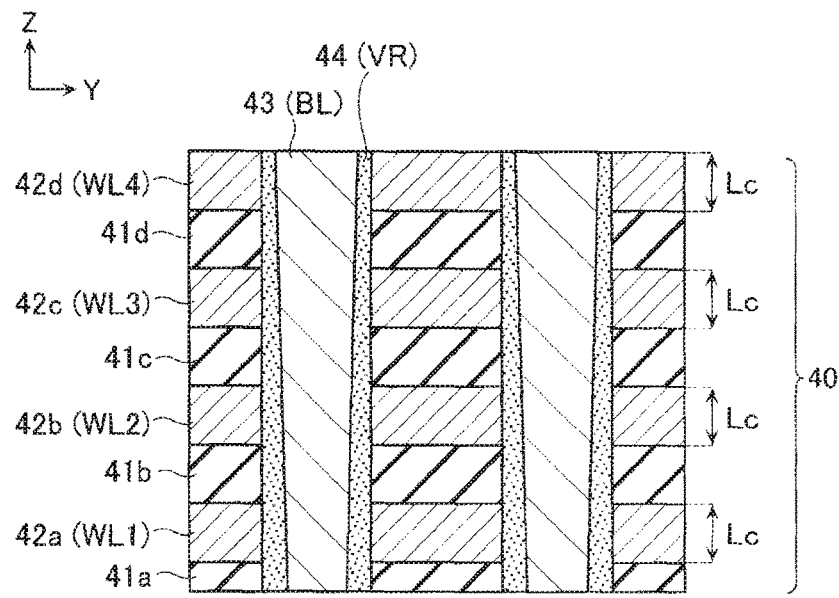
FIG. 19 illustrates a memory layer 40 according to another embodiment when viewed in the X direction.
Figure 20:
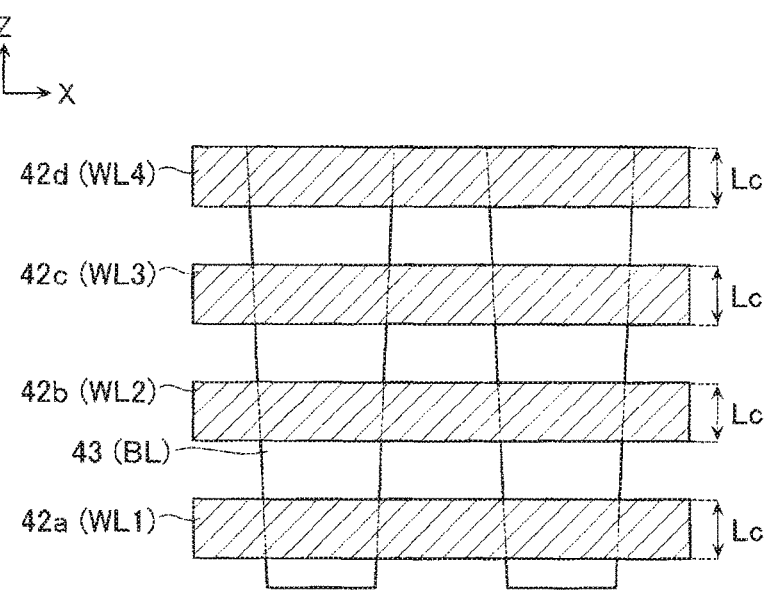
FIG. 20 illustrates a memory layer 40 according to another embodiment when viewed in the Y direction.

For example, with reference to FIGS. 19 and 20, if the resistance of the variable resistive elements VR may be changed uniformly in the fourth embodiment, the Z-direction thicknesses Lc of the conductive layers 42a to 42d may be constant.

What is claimed is:

1. A semiconductor memory device comprising a memory cell array, the memory cell array comprising memory cells, the memory cell array comprising:
    first conductive layers stacked at a predetermined pitch in a first direction perpendicular to a substrate, the first conductive layers extending in a second direction parallel to the substrate;
    a memory layer provided in common on side surfaces of the first conductive layers on a third direction, the third direction extending in a direction perpendicular to the first and second directions; and
    a second conductive layer comprising a first side surface on the third direction in contact with the side surfaces of the first conductive layers via the memory layer, the second conductive layer extending in the first direction,
    an entire width in the second direction of the first side surface at an upper end thereof being larger than an entire width in the second direction of the first side surface at a lower end thereof, the lower end of the first side surface being closer to the substrate than the upper end of the first side surface, and
    an entire thickness in the third direction of the memory layer between the side surfaces of the first conductive layers and the first side surface of the second conductive layer at an upper end thereof being smaller than an entire thickness in the third direction of the memory layer between the side surfaces of the first conductive layers and the first side surface of the second conductive layer at a lower end thereof, the lower end of the memory layer being closer to the substrate than the upper end of the memory layer.

2. The semiconductor memory device according to claim 1, wherein
    the memory cell array further comprises:
    a selection transistor having a first end connected to one end of the second conductive layer;
    a select gate line connected to a gate of the selection transistor; and
    a wiring line connected to a second end of the selection transistor.

3. The semiconductor memory device according to claim 1,
    the memory cell array further comprising:
    a third conductive layer extending in the third direction;
    a semiconductor layer in contact with an upper surface of the third conductive layer and a lower surface of the second conductive layer, the semiconductor layer extending in the first direction;
    a gate insulating layer provided on a side surface of the semiconductor layer; and
    a fourth conductive layer provided on the side surface of the semiconductor layer via the gate insulating layer, the fourth conductive layer extending in the second direction.

4. The semiconductor memory device according to claim 1, wherein
the memory layer is a variable resistance layer and is provided as a plane in the first and second directions.

5. The semiconductor memory device according to claim 1, wherein
the first conductive layers are formed in a comb shape when viewed in the first direction.

6. A semiconductor memory device comprising a memory cell array, the memory cell array comprising memory cells, the memory cell array comprising:
first conductive layers stacked at a predetermined pitch in a first direction perpendicular to a substrate, the first conductive layers extending in a second direction parallel to the substrate;
a first memory layer provided in common on side surfaces of the first conductive layers on a third direction, the third direction extending in a direction perpendicular to the first and second directions; and
a second conductive layer comprising a first side surface on the third direction in contact with the side surfaces of the first conductive layers via the first memory layer, the second conductive layer extending in the first direction, and
an entire thickness in the third direction of the first memory layer between the side surfaces of the first conductive layers and the first side surface of the second conductive layer at an upper end thereof being smaller than an entire thickness in the third direction of the first memory layer between the side surfaces of the first conductive layers and the first side surface of the second conductive layer at a lower end thereof, the lower end of the first memory layer being closer to the substrate than the upper end of the first memory layer.

7. The semiconductor memory device according to claim 6, wherein
an entire width in the third direction of the second conductive layer at an upper end thereof being larger than an entire width in the third direction of the second conductive layer at a lower end thereof, the lower end of the second conductive layer being closer to the substrate than the upper end of the second conductive layer.

8. The semiconductor memory device according to claim 6, wherein
the first memory layer is a variable resistance layer.

9. The semiconductor memory device according to claim 6, further comprising:
third conductive layers stacked at the predetermined pitch in the first direction, the third conductive layers extending in the second direction; and
a second memory layer provided in common on side surfaces of the third conductive layers;
the second conductive layer comprising a second side surface in contact with the side surfaces of the third conductive layers via the second memory layer.

10. A semiconductor memory device comprising a memory cell array, the memory cell array comprising memory cells, the memory cell array comprising:
first conductive layers stacked at a predetermined pitch in a first direction perpendicular to a substrate, the first conductive layers extending in a second direction parallel to the substrate;
a memory layer provided in common on side surfaces of the first conductive layers; and
a second conductive layer comprising a first side surface in contact with side surfaces of the first conductive layers via the memory layer, the second conductive layer extending in the first direction,
an entire width in the second direction of the first side surface at a first position being larger than an entire width in the second direction of the first side surface at a second position lower than the first position, and
an entire thickness in the first direction of one of the first conductive layers at the first position being smaller than an entire thickness in the first direction of another one of the first conductive layers at the second position.

11. The semiconductor memory device according to claim 10 wherein
a direction perpendicular to the first and second directions is determined as a third direction,
an entire thickness in the third direction of the memory layer at the first position is smaller than an entire thickness in the third direction of the memory layer at the second position.

12. The semiconductor memory device according to claim 10, wherein
the memory cell array further comprises:
a selection transistor having a first end connected to one end of the second conductive layer;
a select gate line connected to a gate of the selection transistor; and
a wiring line connected to a second end of the selection transistor.

13. The semiconductor memory device according to claim 10, wherein
the memory cell array further comprising:
a third conductive layer extending in a third direction perpendicular to the first and second directions;
a semiconductor layer in contact with an upper surface of the third conductive layer and a lower surface of the second conductive layer, the semiconductor layer extending in the first direction;
a gate insulating layer provided on a side surface of the semiconductor layer; and
a fourth conductive layer provided on the side surface of the semiconductor layer via the gate insulating layer, the fourth conductive layer extending in the second direction.

14. The semiconductor memory device according to claim 10, wherein
the memory layer is a variable resistance layer and is provided as a plane in the first and second directions.

15. The semiconductor memory device according to claim 10, wherein
the first conductive layers are formed in a comb-teeth shape when viewed in the first direction.

* * * * *